(12) United States Patent
Noguchi et al.

(10) Patent No.: US 6,579,917 B1
(45) Date of Patent: Jun. 17, 2003

(54) SURFACE TREATMENT AGENT FOR MODEL

(75) Inventors: Yoshiaki Noguchi, Hirakata (JP); Katsuhiro Shibata, Takasago (JP); Shigeki Matsuta, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/511,365

(22) Filed: Feb. 23, 2000

(30) Foreign Application Priority Data

Feb. 24, 1999 (JP) .......................................... 11/046753
Oct. 5, 1999 (JP) .......................................... 11/284468

(51) Int. Cl.[7] .......................... B29C 35/08; C08F 2/46; C08J 7/18; C08L 63/00
(52) U.S. Cl. ....................... 522/170; 264/401; 427/512; 427/554; 522/95; 523/400; 525/123
(58) Field of Search ................... 522/95, 170; 523/400; 524/919; 525/123; 427/554, 512; 264/401

(56) References Cited

U.S. PATENT DOCUMENTS

| | | | | |
|---|---|---|---|---|
| 4,209,582 A | * | 6/1980 | Merrill et al. ............ 522/95 X |
| 4,243,768 A | * | 1/1981 | Simpson .................. 525/123 X |
| 4,563,372 A | * | 1/1986 | Kurauchi et al. ....... 525/123 X |
| 4,746,469 A | * | 5/1988 | Yamashita ................ 522/95 X |
| 4,937,173 A | * | 6/1990 | Kanda et al. ............. 522/95 X |
| 5,110,857 A | * | 5/1992 | Inagaki et al. ........... 522/95 X |
| 5,234,636 A | * | 8/1993 | Hull et al. .................. 264/401 |
| 5,254,604 A | * | 10/1993 | Mori et al. .................... 522/95 |
| 5,609,814 A | * | 3/1997 | Takano ................... 427/554 X |
| 5,679,722 A | * | 10/1997 | Tamura .................. 522/170 X |
| 6,287,745 B1 | * | 9/2001 | Yamamura et al. ..... 522/170 X |

* cited by examiner

*Primary Examiner*—Richard D. Lovering
(74) *Attorney, Agent, or Firm*—Arent Fox Kintner Plotkin & Kahn

(57) ABSTRACT

A surface treatment agent for a model according to this invention can improve finish of a surface treatment for a model and can shorten time necessary for finish. The surface treatment agent is used for filling stair-steppings on a model surface, mainly comprising base resin which is cured by physical action and microparticles which have good wettability to the base resin and have a particle diameter equal to or smaller than the stair-stepping.

6 Claims, 4 Drawing Sheets

SURFACE TREATMENT AGENT FOR MODEL

BACKGROUND OF THE INVENTION

1. Field of the Invention

This invention relates to a surface treatment agent for treating stair-steppings on a model surface.

2. Description of the Prior Art

A stereolithography model formed by a stereolithography apparatus given as one general example of a model is explained.

A general stereolithography apparatus as shown in FIG. 1 is provided with an elevating table 4 which is driven by an elevation control device 3 and which is arranged horizontally in photo curable resin 2 in a resin tank 1, and a projector 5 for irradiating light beam to a liquid level of the photo curable resin 2. A motion control device 6 controls a X-Y direction motion of the projector 5 in plane.

A dipper 11 and a knife 13 are arranged in the resin tank 1. The dipper 11 is controlled by a dipper driving control device 10 so as to drive and dip up the photo curable resin 2 from the resin tank 1 and supply the resin to the elevating table 4. The knife 13 is controlled separately from the dipper 11 by a knife driving device 12 so as to move horizontally in order to smooth a surface of the photo curable resin 2 supplied on the elevating table 4.

Ultra violet laser beam is supplied to the projector 5 from a UV laser device 8 through an optical filter 7. The optical filter 7 adjusts output from the UV laser device 8. A control computer 9 controls the elevation control device 3, the motion control device 6, the optical filter 7, the dipper control device 10, and the knife control device 12.

Data on a shape of a solid molded article designed by CAD system is sliced for separately making contour line data. When the contour line data is supplied to the control computer 9, the elevating table descends in the resin tank 1 by an constant pitch (approximately 0.05–0.3 mm), the dipper 11 supplies the photo curable resin 2 onto the elevating table 4, and the knife 13 smoothes a surface of the photo curable resin 2 on the elevating table 4. Then, ultra violet laser beam from the projector 5 scans the photo curable resin 2 on the elevating table 4 to the X-Y direction by corresponding to the contour line data.

As a result, the cured resin is deposited in sequence so as to form a shape corresponding to the contour line data, and a predetermined shaped solid article is formed on the elevating table 4.

Motions of the dipper 11 and the knife 13 are explained by referring to FIGS. 2 and 3.

As shown in FIG. 2, a horizontal drive motor 10a moves the dipper 11 horizontally. A guide 10c is linked with a dipper horizontal rail 10b so as: to horizontally move. The guide 10c is mounted on the dipper 11 through a dipper perpendicular rail 10e which is described later. The horizontal drive motor 10a is linked with the guide 10c by a drive belt (not shown) and the guide 10c moves by driving of the horizontal drive motor 10a, and thus the dipper 11 moves horizontally. A perpendicular drive motor 10d moves the dipper 11 perpendicularly. The dipper perpendicular rail 10e is mounted on the dipper 11 by piercing the guide 10c at both ends. The perpendicular rail 10e is linked with the perpendicular drive motor 10d by a link mechanism (not shown). By means of drive of the perpendicular driving motor 10d, the dipper 11 moves up and down along the dipper perpendicular rail 10e, making the guide 10c as a center. The above compositions 10a–10e compose the dipper control device 10.

A horizontal drive motor 12a moves the knife 13 horizontally. A guide 12c is linked with a knife horizontal rail 12b so as to move horizontally. The knife 13 is mounted to the guide 12c. The guide 12c is linked with the horizontal drive motor 12a by means of a driving belt (not shown), and the guide 12c moves by means of drive of the horizontal drive motor 12a and the knife 13 moves horizontally. The above compositions 12a–12c compose the knife control device 12.

Motions of these compositions are explained by referring to FIG. 3.

In the step ①, the dipper 11 is lifted up from the resin tank 1. In the step ②, the dipper 11 moves horizontally for supplying the photo curable resin 2 onto the elevating table 4, and the knife 13 moves horizontally while keeping the predetermined level for smoothing a surface of the photo curable resin 2. In the final step ③, when the dipper 11 reaches over the elevating table 4, the dipper 11 descends in the resin tank 1 and the preparation for stereolithography is finished.

Then, the projector 5 moves for irradiating UV laser beam to the photo curable resin 2 and curing the resin 2 so that a stereolithography model can be formed.

The above stereolithography apparatus deposits and cures photo curable resin in sequence for forming the stereolithography model 14 When the model is used as a simple resin mold for making a resin prototype, it is necessary to improve its strength.

In that case, as disclosed in JP 07-205157A, it is possible to improve strength by diffusing and mixing whisker of needle shape of which diameter is 0.3–1 $\mu$m, length is 10–70 $\mu$m, and aspect ratio is 10–100 in the photo curable resin.

However, stair-steppings are generated on a surface of the stereolithography model formed by the above stereolithography apparatus due to its forming method. Particularly, when using for making a simple resin mold, the stair-steppings apparently appear on a surface of the molded article, and it degrades the quality of the mold.

SUMMARY OF THE INVENTION

The stair-steppings have been filed and cut manually to finish in the conventional method. As a result, finish of the stereolithography model requires time and increases cost for it.

Regarding other models made by other methods, not limited to a stereolithography model, stair-steppings on a surface are filed and cut manually to finish, and it requires time and cost.

The present invention was made to solve these problems, and has an objective to improve finish of a model surface and reduce time necessary for that operation.

A surface treatment agent according to this invention is used for filling stair-steppings on a model surface, mainly containing base resin which is cured by physical action and microparticles which have good wettability to the base resin and have a particle diameter equal to or smaller than the stair-stepping.

The model is a stereolithography model formed by depositing and curing photo curable resin by light irradiation.

The particle diameter of the microparticle is not less than 1 $\mu$m and not more than a size of the stair-stepping.

The microparticles are mixed in the base resin at a volume ratio 1:2.13 at maximum.

The base resin is epoxy photo curable resin.

The base resin is urethane photo curable resin.

The above composition can improve finish of a model surface and shorten time for finish.

The foregoing and other objects, features, aspects and advantages of the present invention will become more apparent from the following detailed description of the present invention when collected conjunction with the accompanying drawings.

DESCRIPTION OF THE PREFERRED EMBODIMENT(S)

Figure 1:
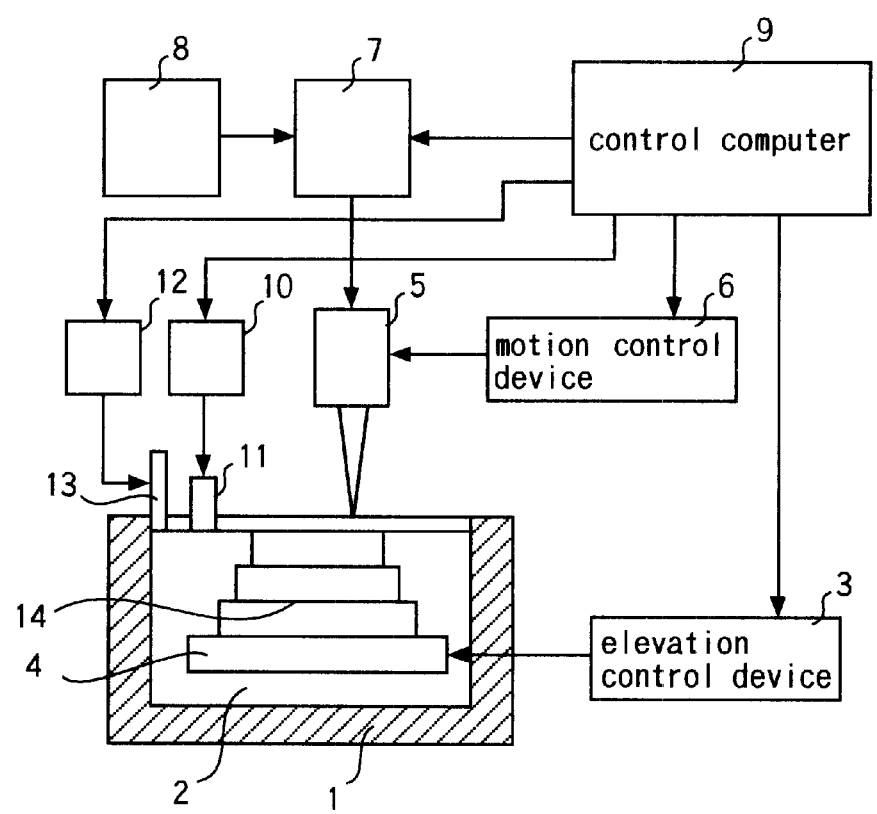
FIG. 1 is a schematic view of a stereolithography apparatus according to the present invention.
Figure 2:
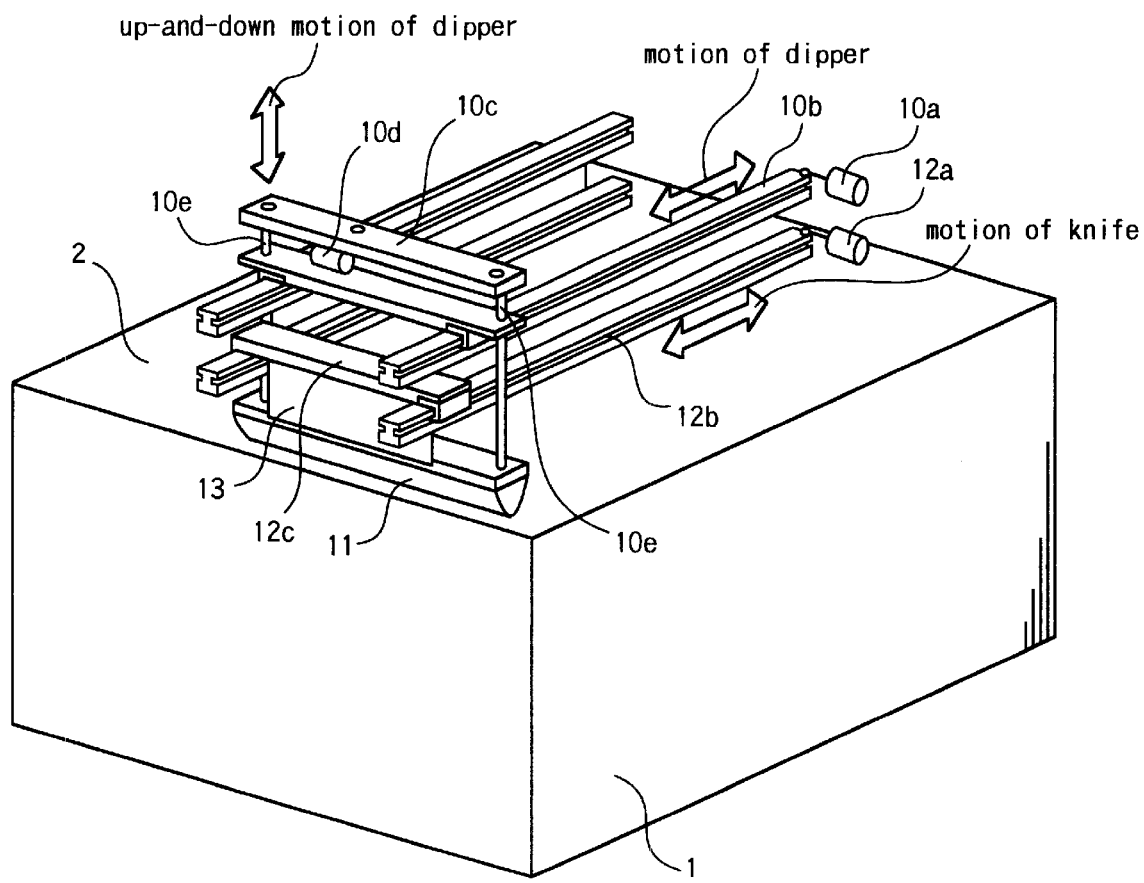
FIG. 2 is a perspective view illustrating a detail composition of a dipper and a knife shown in FIG. 3.
Figure 3:
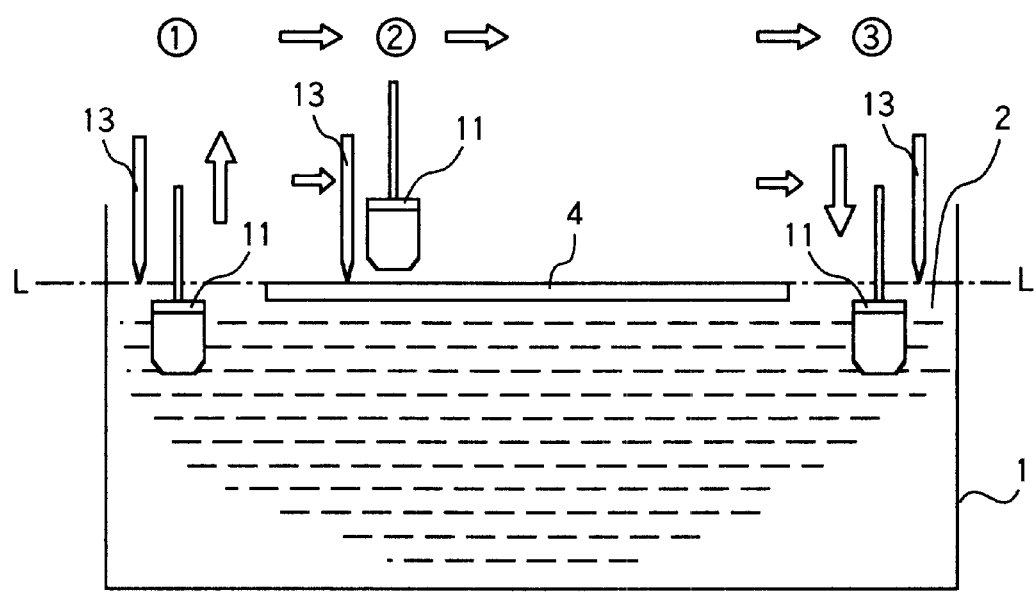
FIG. 3 is a schematic view illustrating motions of the dipper and the knife.
Figure 4:
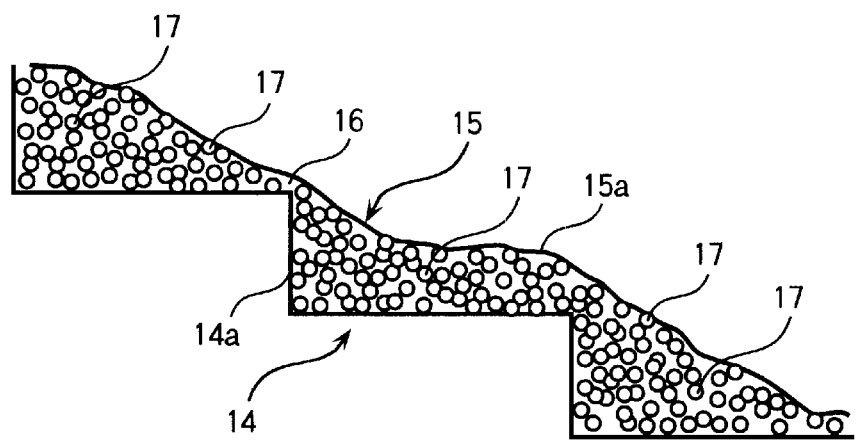
FIG. 4 is a schematic cross-sectional view illustrating a surface treatment agent applied to stair-steppings of a stereolithography model.

As shown in FIG. 4, a stereolithography model 14 is formed by depositing photo curable resin, for example, urethane photo curable resin or epoxy photo curable resin and curing it by light irradiation. Stair-steppings 14a are generated when the stereolithography model is formed. A surface treatment agent 15 smoothes a surface of the stereolithography model 14 by filling the stair-steppings 14a.

A model in the present invention can be a solid object formed of any material, such as an object formed by compressing a metal powder or pottery but is not limited to the above described stereolithography model. The stereolithography model 14 is one example of a general type of model explained herein after.

Base resin 16 has a property of being cured by physical action such as heat or light. As the base resin 16, photo curable resin which is cured by light irradiation, such as urethane photo curable resin or epoxy photo curable resin can be given.

Examples of urethane photo curable resin are urethane acrylate resin and denatured polyurethane acrylate resin. Examples of epoxy photo curable resin are epoxy acrylate i resin and epoxy compound. Examples of other photo curable resins are oligoester acrylate resin, photosensitive polyimide, amino alkyld, vinyl ether, oxetene, spiroortho ester compound, and monomer or oligomer such as vinyl ether-maleic acid and thiolene.

Examples of thermoset resin are phenol resin, urea resin, melamine resin, unstaturated polyester resin, epoxy resin, urethane resin, and silicone resin. Photo curable resin is given, as an example in this description.

Microparticles 17 are mixed in the base resin 16. Since an amount of microparticles mixed in the base resin can be adjusted, the viscosity of the surface treatment agent is adjustable from a degree, by which the microparticles do not overflow from the stair-steppings 14a before light irradiation, to a degree capable of spraying by a spray gun when the surface treatment agent 15 is applied on the stair-steppings 14a of the, stereolithography model 14. In the concrete, it is found from experiments that the volume ratio between the base resin and the microparticles should be 1:2.13 at maximum or less.

The volume ratio in this case can be found from a mix of the: microparticles and the base resin shown in a cross-section of a model to which the surface treatment agent is applied. Operation is performed on condition that the above mix is deposited in a perpendicular direction. However, other methods for operation can be used.

As the microparticles 17, polymethyl methacrylate microparticles are used, which have a cross-link structure and good wettability to the base resin 16 so that the applied microparticles can settle down in several dozens of seconds. The wettability means a contact angle between liquid and solid. When liquid makes solid wet, the contact angle reads 0° to 90°. When wettability is good, the contact angle becomes smaller. The contact angle between polymethyl methacrylate microparticles of a cross-link structure and urethane photo curable resin or epoxy photo curable resin in the present invention is not greater than 20°. Materials having a contact angle of not greater than 90° may be used. In other case, materials having good wettability to the base resin 16 and having a contact angle in a range in which the applied microparticles can settle down within several dozens of seconds can be used.

A particle diameter of the microparticles 17 should be from 1 μm to a size of the stair-stepping so as to be equal to or smaller than the stair-stepping and the surface treatment agent should have a volume enough to fill the stair-steppings 14a and the above viscosity.

Procedures for applying the surface treatment agent 15 are explained.

When the surface treatment agent has high viscosity, the stair-steppings 14a of the stereolithography model 14 are filled by applying the surface treatment agent 15 with a pallet.

As shown in FIG. 4, the is unleveled, and the mixed microparticles appear on the surface 15a of the surface treatment agent 15. The surface appearance is matted due to the microparticles 17.

Figure 5:
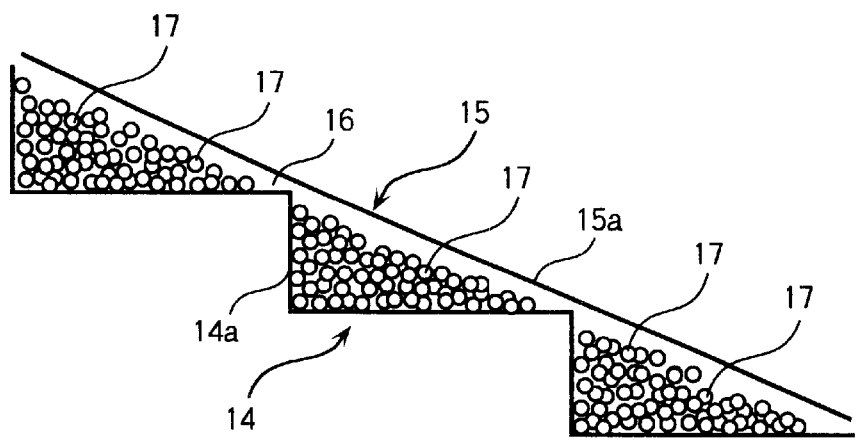
FIG. 5 is a schematic cross-sectional view illustrating that the surface treatment agent applied in FIG. 4 is leveled off.

Then, the applied surface treatment agent is leveled off by a pallet (not shown). When it is left for several dozens of seconds, the microparticles 17 protruded from the surface 15a of the surface treatment agent 15 settle down in the base resin 16 since the base resin 16 and the microparticles 17 have good wettability. Thus, as shown in FIG. 5, the microparticles 17 settle down and do not appear on the surface of the base resin 16, and the surface 15a of the surface treatment agent 15 becomes a level and smooth surface so that a polished surface is produced.

As a final step, the surface treatment agent 15 is cured by light irradiation, and is heat-treated to improve the strength of the surface treatment agent 15.

When the viscosity of the surface treatment agent 15 is low, the stair-steppings 14a are filled by spraying the surface treatment agent 15 to the stair-steppings 14a of the stereolithography model 14. Spraying does not cause unevenness as in a case of the first surface treatment agent, thus it is not necessary to level off the surface treatment agent 15 by a pallet after applying it.

When it is left for several dozens of seconds as in the case of the first surface treatment agent, the microparticles 17 protruded from the surface 15a of the surface treatment agent 15 settle down in the base resin 16 since the base resin 16 and the microparticles 17 have good wettability. Thus, the microparticles 17 settle down and do not appear on the surface of the base resin 16 as shown in FIG. 5, and the surface 15a of the surface treatment agent 15 becomes a level and smooth surface so that a polished surface is produced.

A wettability of the surface of the stereolithography model 14 and the surface treatment agent 15 is determined and it is found that the surface can be smooth without uneven parts and a polished surface is produced when a contact angle is not greater than 50°. The contact angle between the stereolithography model 14 and the surface treatment agent 15 which is made by mixing the base resin 16 and the microparticles 17 is determined.

By the above processes, application of the surface treatment agent 15 can be performed easily and surface finish is improved and time for finish can be shortened, although the conventional method requires heavy work such as manual cutting for a surface treatment of the stereolithography model 14.

When photo curable resin is used as base resin, the viscosity does not lower, and finish of a filled stair-steppings 14a can be improved.

Although the present invention has been described and illustrated in detail, it is clearly understood that the same is and example only and is not to be taken by way of limitation by way of illustration, the spirit and scope of the present invention being limited only by the terms of the appended claims.

What is claimed is:

1. A surface treatment agent for a model, comprising
    a base resin having a property of being cured by physical action, and
    microparticles having a particle diameter equal to or less than a stair-stepping on a model surface and having good wettability to said base resin,
    wherein said base resin is an epoxy photo curable resin, and
    wherein a particle diameter of said microparticle is not less than 1 $\mu$m and not more than a size of the stair-stepping.

2. The surface treatment agent for a model according to claim 1, wherein a contact angle of said microparticles to said to said base resin is less than 90° C.

3. The surface treatment agent for a model according to claim 1, wherein said microparticles are mixed in said base resin at a volume ratio of 1:2.13 at maximum.

4. A surface treatment agent for a model, comprising
    a base resin having a property of being cured by physical action, and
    microparticles having a particle diameter equal to or less than a stair-stepping on a model surface and having good wettability to said base resin,
    wherein said model is a stereolithography model formed by depositing and curing a photo curable resin by light irradiation,
    wherein said base resin is an epoxy photo curable resin, and
    wherein a particle diameter of said microparticle is not less than 1 $\mu$m and not more than a size of the stair-stepping.

5. The surface treatment agent for a model according to claim 4, wherein said microparticles are mixed in said base resin at a volume ratio of 1:2.13 at maximum.

6. The surface treatment agent for a model according to claim 4, wherein a contact angle between the photo curable article and the surface treatment agent which is made by mixing the base resin and the microparticles is not more than 50° C.

* * * * *